(12) United States Patent
Tan et al.

(10) Patent No.: US 11,165,039 B1
(45) Date of Patent: Nov. 2, 2021

(54) DISPLAY PANEL AND MANUFACTURING METHOD THEREOF

(71) Applicant: SHENZHEN CHINA STAR OPTOELECTRONICS SEMICONDUCTOR DISPLAY TECHNOLOGY CO., LTD., Shenzhen (CN)

(72) Inventors: Wei Tan, Shenzhen (CN); Jinchuan Li, Shenzhen (CN)

(*) Notice: Subject to any disclaimer, the term of this patent is extended or adjusted under 35 U.S.C. 154(b) by 204 days.

(21) Appl. No.: 16/623,785

(22) PCT Filed: Nov. 27, 2019

(86) PCT No.: PCT/CN2019/121171
§ 371 (c)(1),
(2) Date: Dec. 18, 2019

(87) PCT Pub. No.: WO2021/082146
PCT Pub. Date: May 6, 2021

(30) Foreign Application Priority Data

Oct. 30, 2019 (CN) .......................... 201911042322.1

(51) Int. Cl.
*H01L 21/00* (2006.01)
*H01L 51/52* (2006.01)
*H01L 51/56* (2006.01)
*H01L 27/32* (2006.01)

(52) U.S. Cl.
CPC ...... *H01L 51/5228* (2013.01); *H01L 51/5253* (2013.01); *H01L 51/5275* (2013.01); *H01L 51/56* (2013.01); *H01L 27/3244* (2013.01)

(58) Field of Classification Search
CPC ........................ H01L 51/5228; H01L 51/5275
See application file for complete search history.

(56) References Cited

U.S. PATENT DOCUMENTS

| | | | | |
|---|---|---|---|---|
| 5,872,415 A | * | 2/1999 | Dreifus | H01L 21/02527 310/311 |
| 5,907,768 A | * | 5/1999 | Malta | H04R 17/00 438/105 |
| 7,560,366 B1 | * | 7/2009 | Romano | C30B 11/12 438/503 |
| 2003/0196987 A1 | * | 10/2003 | Kung | H05K 3/143 216/2 |

(Continued)

FOREIGN PATENT DOCUMENTS

| | | |
|---|---|---|
| CN | 108496260 A | 9/2018 |
| CN | 110301053 A | 10/2019 |

(Continued)

*Primary Examiner* — Caleb E Henry

(57) ABSTRACT

The present invention provides a display panel and a manufacturing method thereof. By using a laser ablation to form a patterned nucleation inhibiting layer with good grid continuity and high accuracy, and using a nucleation inhibiting layer to inhibit a conductive layer from being formed on a surface of the nucleation inhibiting layer and to form the conductive layer with good continuity on a common electrode in a non-pixel region, thereby improving a resistance voltage drop of a cathode formed by the common electrode and the conductive layer, and improving uniformity of brightness of a display on the display panel.

18 Claims, 5 Drawing Sheets

(56) References Cited

U.S. PATENT DOCUMENTS

| | | | |
|---|---|---|---|
| 2005/0051766 A1* | 3/2005 | Stokes | H01L 33/06 |
| | | | 257/17 |
| 2005/0110006 A1* | 5/2005 | Aizenberg | B82Y 30/00 |
| | | | 257/40 |
| 2019/0181346 A1 | 6/2019 | Chang et al. | |
| 2020/0075864 A1 | 3/2020 | Helander et al. | |
| 2020/0194676 A1* | 6/2020 | Chang | H01L 51/0085 |
| 2020/0280017 A1 | 9/2020 | Helander et al. | |

FOREIGN PATENT DOCUMENTS

| | | |
|---|---|---|
| WO | 2018198052 A1 | 11/2018 |
| WO | 2018211460 A1 | 11/2018 |

\* cited by examiner

DISPLAY PANEL AND MANUFACTURING METHOD THEREOF

This application claims the priority of a Chinese patent application filed on Oct. 30, 2019 with the Chinese Patent Office, Application number as: 201911042322.1, and the title of the invention as "display panel and manufacturing method thereof." The entire contents of which are incorporated herein by reference.

FIELD OF INVENTION

The present application relates to the field of display technology, and in particular, to a display panel and a manufacturing method thereof.

BACKGROUND OF INVENTION

Organic light emitting display (OLED) devices have advantages such as self-luminous, all-solid-state, low driving voltages, high luminous efficiency, short response time, high sharpness and contrast, near 180° viewing angle, wide operating temperature ranges, and can realize flexible display and full color display with large areas, and are recognized as the most promising display devices by industries. At present, applications of small-sized OLEDs in mobile smart terminals and in-vehicle fields has fully surpassed liquid crystal display (LCD) devices. In the future, large-size top-emitting and high-resolution OLED display panels will also be fully applied and replace liquid crystal display devices. The light-emitting principle of the OLED display devices is that semiconductor materials and organic light-emitting materials are driven by an electric field, and the organic light-emitting materials emit light through carrier injection and recombination. Current OLED display panels generally comprise a TFT substrate, an anode disposed on the TFT substrate, an organic light emitting layer disposed on the anode, and a cathode disposed on the organic light emitting layer. Because the top-emitting OLED display panels have a structure with a common cathode, the common cathode generally uses a metal or a transparent oxide having a high transmittance, and metal cathodes have high surface resistance. For large-size OLED display panels, the common cathode surface resistance is high, and there will be a serious power voltage drop (IR-drop), resulting in poor brightness uniformity at different locations of the large-sized OLED display panels.

Technical Problem

An object of the present invention is to provide a display panel and a manufacturing method thereof, so as to solve problems that large-sized OLED display panels have large resistance voltage drops of a common cathode, resulting in poor brightness uniformity at different positions of the OLED display panels.

Technical Solution

The present invention provides a manufacturing method of a display panel, which comprises following steps of:
providing a substrate, wherein the substrate comprises a pixel region and a non-pixel region disposed outside the pixel region, and the substrate comprises a common electrode disposed in the pixel region and the non-pixel region;
forming a nucleation inhibiting layer on the common electrode disposed in the pixel region and the non-pixel region, wherein the nucleation inhibiting layer is used to inhibit a conductive layer from being formed on a surface of the nucleation inhibiting layer;
using a laser to ablate and remove the nucleation inhibiting layer in the non-pixel region to form a patterned nucleation inhibiting layer; and
forming the conductive layer on the common electrode in the non-pixel region;
wherein a thickness of the conductive layer is greater than a thickness of the patterned nucleation inhibiting layer; and
wherein a thickness of the nucleation inhibiting layer is 25 nanometers to 80 nanometers.

In the manufacturing method of the display panel, the step of using the laser to ablate and remove the nucleation inhibiting layer in the non-pixel region comprises following steps of:
the laser outputs light with a wavelength of 340 nm to 370 nm, works with an output power of 1.5 Watt to 2.2 Watt, and outputs frequency of 500 kHz-2000 kHz to ablate the nucleation inhibiting layer in the non-pixel region to form the patterned nucleation inhibiting layer.

In the manufacturing method of the display panel, further comprising following steps of:
forming a capping layer on a surface of the patterned nucleation inhibiting layer away from the substrate, wherein a thickness of the capping layer is greater than the thickness of the patterned nucleation inhibiting layer.

In the manufacturing method of the display panel, a sum of the thicknesses of the capping layer and the patterned nucleation inhibiting layer ranges from 400 nanometers to 600 nanometers.

In the manufacturing method of the display panel, further comprising following steps of:
forming an encapsulation layer covering the capping layer and the conductive layer;
wherein a refractive index of the common electrode is greater than a refractive index of the patterned nucleation inhibiting layer, the refractive index of the patterned nucleation inhibiting layer is greater than or equal to a refractive index of the capping layer, and the refractive index of the capping layer is greater than a refractive index of the encapsulating layer.

In the manufacturing method of the display panel, the common electrode is made of metal or metal oxide.

In the manufacturing method of the display panel, a material of the conductive layer comprises magnesium, a material of the nucleation inhibiting layer is selected from the group consisting of 3-(4-biphenyl)-4-phenyl-5-tert-butylphenyl-1,2,4-triazole, bis(2-methyl-8-hydroxyquinoline-p-hydroxy)-4-biphenyl aluminum phenol, N(biphenyl-4-yl)9,9-dimethyl-N-(4(9-phenyl-9H-carbazol-3-yl)phenyl)-9H-fluoren-2-amine.

The present invention provides a manufacturing method of a display panel, which comprises following steps of:
providing a substrate, wherein the substrate comprises a pixel region and a non-pixel region disposed outside the pixel region, and the substrate comprises a common electrode disposed in the pixel region and the non-pixel region;
forming a nucleation inhibiting layer on the common electrode disposed in the pixel region and the non-pixel region, wherein the nucleation inhibiting layer is used to inhibit a conductive layer from being formed on a surface of the nucleation inhibiting layer;
using a laser to ablate and remove the nucleation inhibiting layer in the non-pixel region to form a patterned nucleation inhibiting layer; and forming the conductive layer on the common electrode in the non-pixel region.

In the manufacturing method of the display panel, the step of using the laser to ablate and remove the nucleation inhibiting layer in the non-pixel region comprises following steps of:

the laser outputs light with a wavelength of 340 nm to 370 nm, works with an output power of 1.5 Watt to 2.2 Watt, and outputs frequency of 500 kHz-2000 kHz to ablate the nucleation inhibiting layer in the non-pixel region to form the patterned nucleation inhibiting layer In the manufacturing method of the display panel, the laser outputs the light with a wavelength of 355 nanometers, and the output power of the laser is 1.7 Watts to 2.0 Watts.

In the manufacturing method of the display panel, a thickness of the nucleation inhibiting layer is 25 nanometers to 80 nanometers.

In the manufacturing method of the display panel, further comprising following steps of:

forming a capping layer on a surface of the patterned nucleation inhibiting layer away from the substrate, wherein a thickness of the capping layer is greater than a thickness of the patterned nucleation inhibiting layer.

In the manufacturing method of the display panel, a sum of the thicknesses of the capping layer and the patterned nucleation inhibiting layer ranges from 400 nanometers to 600 nanometers.

In the manufacturing method of the display panel, further comprising following steps of:

forming an encapsulation layer covering the capping layer and the conductive layer;

wherein a refractive index of the common electrode is greater than a refractive index of the patterned nucleation inhibiting layer, the refractive index of the patterned nucleation inhibiting layer is greater than or equal to a refractive index of the capping layer, and the refractive index of the capping layer is greater than a refractive index of the encapsulating layer.

In the manufacturing method of the display panel, the common electrode is made of metal or metal oxide.

In the manufacturing method of the display panel, a thickness of the conductive layer is greater than the thickness of the patterned nucleation inhibiting layer.

In the manufacturing method of the display panel, a material of the conductive layer comprises magnesium, a material of the nucleation inhibiting layer is selected from the group consisting of 3-(4-biphenyl)-4-phenyl-5-tert-butylphenyl-1,2,4-triazole, bis(2-methyl-8-hydroxyquinoline-p-hydroxy)-4-biphenyl aluminum phenol, N(biphenyl-4-yl)9,9-dimethyl-N-(4(9-phenyl-9H-carbazol-3-yl) phenyl)-9H-fluoren-2-amine.

A display panel, wherein the display panel is manufactured by the mentioned manufacturing method.

Beneficial Effect

The present invention provides a display panel and a manufacturing method thereof. By using a laser ablation to form a patterned nucleation inhibiting layer with good grid continuity and high accuracy, and using a nucleation inhibiting layer to inhibit a conductive layer from being formed on a surface of the nucleation inhibiting layer and to form the conductive layer with good continuity on a common electrode in a non-pixel region, thereby improving a resistance voltage drop of a cathode formed by the common electrode and the conductive layer, and improving uniformity of brightness of a display on the display panel.

DETAILED DESCRIPTION OF PREFERRED EMBODIMENTS

The technical solutions in the embodiments of the present invention will be clearly and completely described below with reference to the drawings in the embodiments of the present invention. Obviously, the described embodiments are only a part of the embodiments of the present invention, but not all the embodiments. Based on the embodiments in the present invention, all other embodiments obtained by those skilled in the art without creative work fall into the scope of the present invention.

Figure 1:
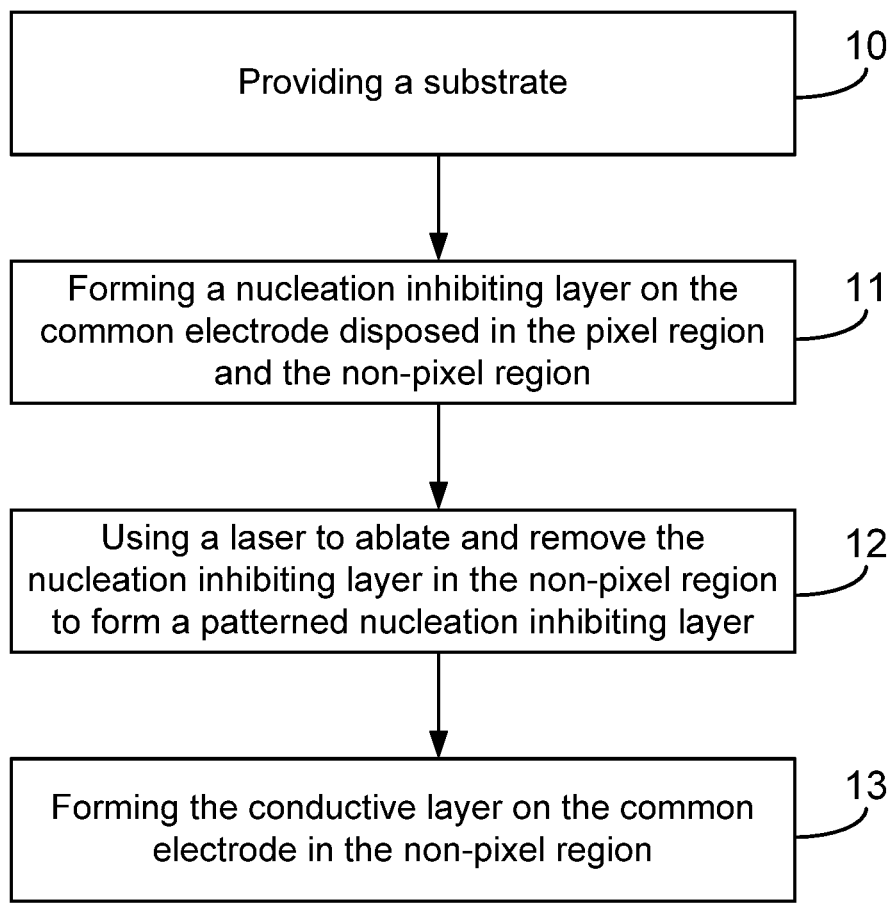
FIG. 1 is a flowchart of a manufacturing method of a display panel according to an embodiment of the present invention.

Please refer to FIG. 1, which is a flowchart of a manufacturing method of a display panel according to an embodiment of the present invention. The manufacturing method of the display panel comprises following steps of:

S10: providing a substrate.

Figure 2A:
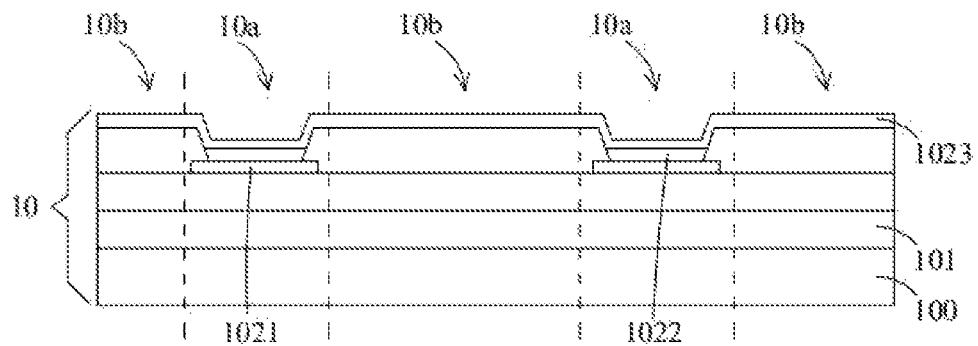
FIG. 2A to FIG. 2F are schematic structural views in a process of manufacturing the display panel according to the embodiment of the present invention.

Specifically, as shown in FIG. 2A, the substrate 10 is an organic light emitting diode array substrate. The substrate 10 comprises a pixel region 10a and a non-pixel region 10b disposed outside the pixel region 10a. The substrate 10 comprises a substrate 100, a thin film transistor array layer 101, and an organic light emitting diode array layer.

The substrate 100 is a glass substrate or a flexible polymer layer, and the flexible polymer layer comprises a polyimide layer.

The thin film transistor array layer 101 comprises a plurality of thin film transistors arranged in an array. The thin film transistors are used to control working states of the organic light emitting diodes in the organic light emitting diode array layer. The thin film transistor may be a metal oxide thin film transistor or a polysilicon thin film transistor.

The organic light emitting diode array layer comprises a plurality of organic light emitting diodes arranged in an array. The organic light emitting diode may comprises a red-light organic light emitting diode, a blue-light organic light emitting diode, and a green-light organic light emitting diode. The organic light emitting diode is a top-emitting organic light emitting diode, that is, the substrate 10 comprises a plurality of independent pixel electrodes 1021, a plurality of independent organic light emitting layers 1022 disposed in the pixel region 10a, and a common electrode 1023 disposed in the pixel region 10a and the non-pixel region 10b. A plurality of independent pixel electrodes 1021 are electrically connected to drain electrodes in the thin film transistor, respectively. The pixel electrodes 1021 are opaque electrodes or transparent electrodes. The pixel electrode 1021 is made of a metal such as Ag, Mg, or a combination of a transparent metal oxide such as indium zinc oxide, indium tin oxide, and a metal layer. The common electrode 1023 is made from metal or metal oxide. For example, the common electrode 1023 is Ag from 10 nm to 100 nm, or the common electrode is an indium tin oxide layer or an indium zinc oxide layer. The organic light emitting diode may further comprises a hole transport layer, a hole injection layer, an electron transport layer, and an electron injection layer, etc., to further improve the light emitting effect of the organic light emitting diode.

A planarization layer, a passivation layer, and a pixel definition layer are provided between the organic light emitting diode array layer and the thin film transistor array layer. The passivation layer forms a surface of the thin film transistor array layer, and is used to prevent ions in organic layers such as the planarization layer from entering the thin film transistor array layer and affect an electrical performance of the thin film transistor. The planarization layer is used to make the surface on which the thin film transistor array layer is formed flatter. The planarization layer is disposed on a surface of the passivation layer away from the thin film transistor array layer. The pixel definition layer is used to define the pixel region 10a and the non-pixel region 10b of the substrate 100. The pixel definition layer is disposed on the surface of the passivation layer away from the planarization layer.

S11: forming a nucleation inhibiting layer on the common electrode disposed in the pixel region and the non-pixel region.

Figure 2B:
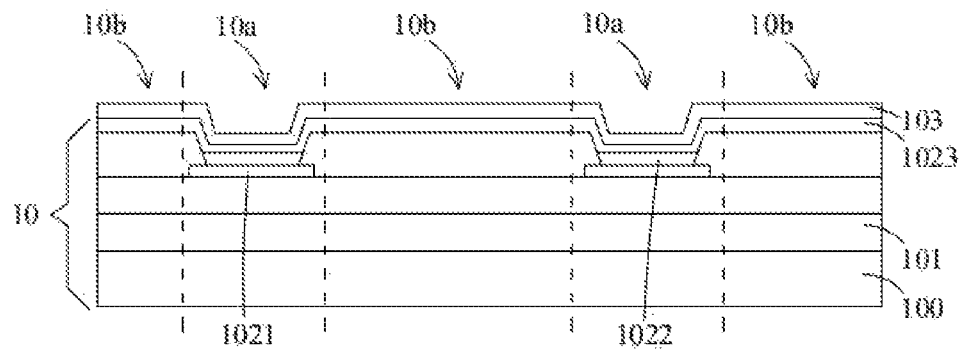

Specifically, as shown in FIG. 2B, the entire surface of the nucleation inhibiting layer 103 is formed on the common electrode 1023 in the pixel region 10a and the non-pixel region 10b by spin coating, vacuum evaporation, printing, and the like. The nucleation inhibiting layer 103 is used to inhibit a conductive layer 104 from being formed on a surface of the nucleation inhibiting layer 103. An initial adhesion probability between the nucleation inhibiting layer 103 and the conductive layer 104 is low, so that the conductive layer 104 does not adhere to the surface of the nucleation inhibiting layer 103. A material of the nucleation inhibiting layer is selected from the group consisting of 3-(4-biphenyl)-4-phenyl-5-tert-butylphenyl-1,2,4-triazole, bis(2-methyl-8-hydroxyquinoline-p-hydroxy)-4-biphenyl aluminum phenol, N(biphenyl-4-yl)9,9-dimethyl-N-(4(9-phenyl-9H-carbazol-3-yl)phenyl)-9H-fluoren-2-amine.

A thickness of the nucleation inhibiting layer is 25 nanometers (nm) to 80 nm. For example, the thickness of the nucleation inhibiting layer 103 is 30 nm, 40 nm, or 50 nm. The thickness of the nucleation inhibiting layer 103 is greater than or equal to 25 nm, which is beneficial to avoid ablation of the nucleation inhibiting layer 103 of the non-pixel region 10b, which causes the common electrode 1023 of the non-pixel region 10b to be over-ablated and affects a normal working performance of the common electrode 1023. The thickness of the nucleation inhibiting layer 103 is less than or equal to 80 nm, which is beneficial to prevent the thickness of the nucleation inhibiting layer 103 in the pixel region 10a from being too large and reducing a light emission rate of the organic light emitting diode.

S12: using a laser to ablate and remove the nucleation inhibiting layer in the non-pixel region to form a patterned nucleation inhibiting layer.

Figure 2C:
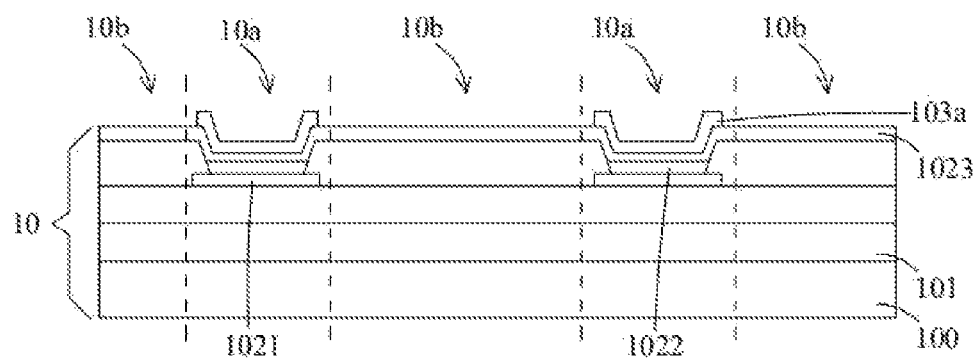

Specifically, as shown in FIG. 2C, the laser outputs light with a wavelength of 340 nm to 370 nm, works with an output power of 1.5 Watt to 2.2 Watt, and outputs frequency of 500 kHz-2000 kHz to ablate the nucleation inhibiting layer 103 in the non-pixel region 10b to form the patterned nucleation inhibiting layer 103a. The wavelength of the laser is 340 nm to 370 nm, which is beneficial to avoid an ablation thickness of the common electrode 1023 exceeds an allowable value when the nucleation inhibiting layer 103 is ablated due to the wavelength of the laser being too small. It is also beneficial to avoid that when the wavelength of the laser is too large, the nucleation inhibiting layer 103 of the non-pixel region 10b cannot be removed, and the conductive layer 104 cannot be formed on the common electrode 1023 of the non-pixel region 10b. Preferably, the laser outputs the light having a wavelength of 355 nm, and the output power is 1.5 watts to 2.2 watts, which avoiding the ablation thickness of the common electrode 1023 exceeds the allowable value when the nucleation inhibiting layer 103 is ablated due to a laser energy output is too high, and also avoiding fail to remove the nucleation inhibiting layer 103 of the non-pixel region 10b when the light energy output by the laser is too low. Preferably, the output power of the laser is from 1.7 Watts to 2.0 Watts. The output frequency of 500 kHz to 2000 kHz is favorable for forming the patterned nucleation inhibiting layer 103a with better grid continuity and higher accuracy.

It should be noted that due to technical reasons, it is currently impossible to form a patterned nucleation inhibiting layer for a large-sized display panel by using a mask. In the embodiment, the laser ablation technology is used to form the patterned nucleation inhibiting layer 103a, so that the patterned nucleation inhibiting layer 103a has advantages of good grid continuity, high accuracy, and high production efficiency. And by optimizing process parameters of the laser ablation to form the patterned nucleation inhibiting layer 103a, the patterned nucleation inhibiting layer 103a has better grid continuity and accuracy, while avoiding damages to the common electrode 1023 of the non-pixel region 10b beyond the allowable range, thereby avoiding affecting a resistance of the common electrode 1023 in the non-pixel region 10b, and improving the display effect of the display panel. In addition, compared to traditional processes, for example, printing conductive silver paste to form a conductive layer, the formed patterned nucleation inhibiting layer 103a has good grid continuity and high accuracy, which also makes subsequent conductive layers 104 have good continuity and high accuracy.

S13: forming the conductive layer on the common electrode in the non-pixel region.

Figure 2D:
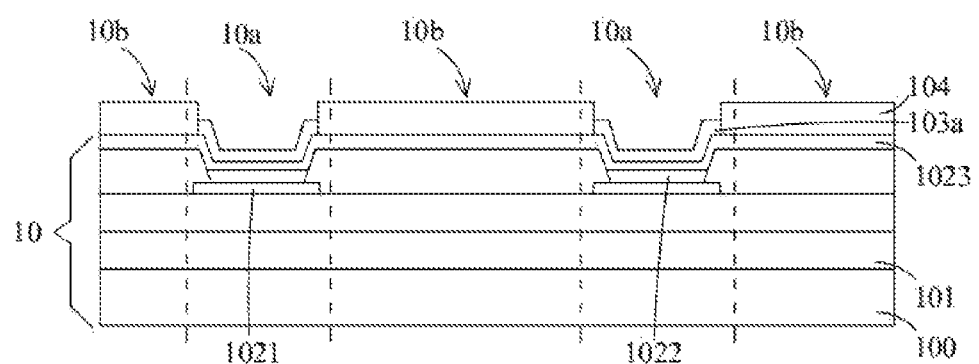

Specifically, as shown in FIG. 2D, a vacuum evaporation is used to form the conductive layer 104 on the common electrode 1023 of the non-pixel region 10b. Due to a self-assembly function between the conductive layer 104 and the patterned nucleation inhibiting layer 103a, the pixel region 10a where the patterned nucleation inhibiting layer 103a is formed cannot form the conductive layer 104, and the conductive layer 104 is formed on the common electrode 1023 of the non-pixel region 10b where the nucleation inhibiting layer 103 is removed. The conductive layer 104 is in electrical contact with the common electrode 1023, which reduces a sheet resistance of the cathode formed by the conductive layer 104 and the common electrode 1023, and improves the resistance voltage drop of the cathode formed by the common electrode 1023 and the conductive layer 104, thereby avoiding problems of uneven resistance voltage drop in the large-sized display panel, and improving uniformity of brightness when the display panel displays.

A material of the conductive layer 104 comprises magnesium. Smaller initial adhesion coefficient is between magnesium and nucleation inhibiting layer. A thickness of the conductive layer 104 is greater than the thickness of the patterned nucleation inhibiting layer 103a, so that the thickness of the conductive layer 104 is larger to further improve the problem of uneven resistance drop of the large-size display panels. The thickness of the conductive layer 104 is greater than or equal to 150 nm and less than 2 micron (μm). For example, the thickness of the conductive layer is 200 nm, 300 nm, 800 nm, or 1 μm.

Figure 2E:
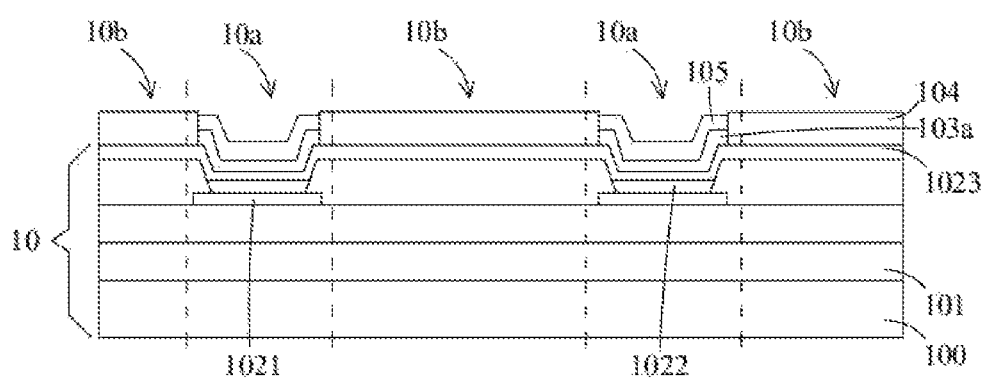

Further, as shown in FIG. 2E, the manufacturing method further comprises the following steps:

Forming a capping layer (CPL) 105 on a surface of the patterned nucleation inhibiting layer 103a away from the substrate 10. The capping layer 105 is used to improve a light emission efficiency of the light emitted by the organic light emitting diode by inhibiting a surface plasmon effect of the light emitted by the organic light emitting diode at the metal/dielectric interface. A material of the capping layer 105 is an organic material. For example, the material of the capping layer 105 is aluminum quinoline (Alq3).

A thickness of the capping layer 105 is greater than the thickness of the patterned nucleation inhibiting layer 103a to further increase the light transmittance of light emitted by the organic light emitting diode through the patterned nucleation inhibiting layer 103a and the capping layer 105. A sum of the thicknesses of the capping layer 105 and the patterned nucleation inhibiting layer 103a ranges from 400 nm to 600 nm to reduce a thickness of the display panel and increase a transmission rate of light emitted from the organic light emitting diode through the capping layer 105 and the patterned nucleation inhibiting layer 103a. For example, the thickness of the patterned nucleation inhibiting layer is 50 nm, and the thickness of the capping layer is 450 nm; or, the thickness of the patterned nucleation inhibiting layer is 80 nm, and the thickness of the capping layer is 420 nm.

It can be understood that the material of the capping layer 105 may be the same as the material of the patterned nucleation inhibiting layer 103a. At this time, the capping layer 105 and the patterned nucleation inhibiting layer 103a are the same film layer and formed by a same process.

Figure 2F:
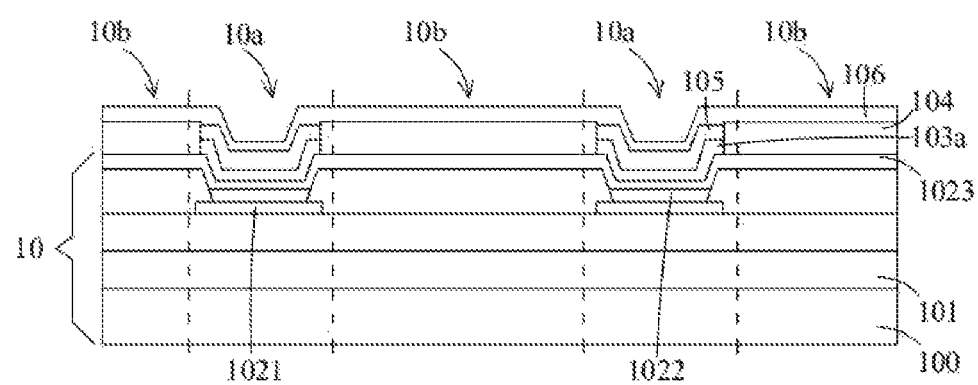

Further, as shown in FIG. 2F, the manufacturing method further comprise the following steps:

Forming an encapsulation layer 106 covering the capping layer 105 and the conductive layer 104. A refractive index of the common electrode 1023 is greater than a refractive index of the patterned nucleation inhibiting layer 103a. The refractive index of the patterned nucleation inhibiting layer 103a is greater than or equal to a refractive index of the capping layer 105. The refractive index of the capping layer 105 is greater than a refractive index of the encapsulating layer 106. Thus, after the light emitted from the organic light emitting diode passes through the common electrode 1023, the patterned nucleation inhibiting layer 103a, the capping layer 105, and the encapsulation layer 106 with a decreasing refractive index, the light transmittance of the light emitted from the organic light emitting diode increases.

The encapsulation layer 106 comprises at least two inorganic insulating layers and an organic insulating layer disposed between the two inorganic layers. The refractive indexes of both the inorganic insulating layer and the organic insulating layer are smaller than that of the patterned nucleation inhibiting layer. For example, the inorganic insulating layer is silicon oxide, and the organic insulating layer is polyacrylate.

It should be noted that the above description is that the display panel is a top-emitting organic light emitting diode display panel, and the display panel may also be a bottom-emitting organic light emitting diode display panel or a transparent organic light emitting diode display panel.

The present invention further provides a display panel, which is manufactured by the above manufacturing method.

The display panel by using a laser ablation to form the patterned nucleation inhibiting layer with good grid continuity and high accuracy, and using the nucleation inhibiting layer to inhibit the conductive layer from being formed on the surface of the nucleation inhibiting layer and to form the conductive layer with good continuity on a common electrode in a non-pixel region, thereby improving the resistance voltage drop of the cathode formed by the common electrode and the conductive layer, and improving the uniformity of the brightness of the display on the display panel.

In the above, various other corresponding changes and modifications can be made according to the technical solutions and technical ideas of the present invention to those skilled in the art, and all such changes and modifications are within the scope of the claims of the present invention.

What is claimed is:

1. A manufacturing method of a display panel, comprising following steps of:
   providing a substrate, wherein the substrate comprises a pixel region and a non-pixel region disposed outside the pixel region, and the substrate comprises a common electrode disposed in the pixel region and the non-pixel region;
   forming a nucleation inhibiting layer on the common electrode disposed in the pixel region and the non-pixel region, wherein the nucleation inhibiting layer is used to inhibit a conductive layer from being formed on a surface of the nucleation inhibiting layer;
   using a laser to ablate and remove the nucleation inhibiting layer in the non-pixel region to form a patterned nucleation inhibiting layer; and
   forming the conductive layer on the common electrode in the non-pixel region;
   wherein a thickness of the conductive layer is greater than a thickness of the patterned nucleation inhibiting layer; and
   wherein a thickness of the nucleation inhibiting layer is 25 nanometers to 80 nanometers.

2. The manufacturing method of the display panel as claimed in claim 1, wherein the step of using the laser to ablate and remove the nucleation inhibiting layer in the non-pixel region comprises following steps of:
   the laser outputs light with a wavelength of 340 nm to 370 nm, works with an output power of 1.5 Watt to 2.2 Watt, and outputs frequency of 500 kHz-2000 kHz to ablate the nucleation inhibiting layer in the non-pixel region to form the patterned nucleation inhibiting layer.

3. The manufacturing method of the display panel as claimed in claim 1, further comprising following steps of:
   forming a capping layer on a surface of the patterned nucleation inhibiting layer away from the substrate, wherein a thickness of the capping layer is greater than the thickness of the patterned nucleation inhibiting layer.

4. The manufacturing method of the display panel as claimed in claim 3, wherein a sum of the thicknesses of the capping layer and the patterned nucleation inhibiting layer ranges from 400 nanometers to 600 nanometers.

5. The manufacturing method of the display panel as claimed in claim 3, further comprising following steps of:
   forming an encapsulation layer covering the capping layer and the conductive layer;
   wherein a refractive index of the common electrode is greater than a refractive index of the patterned nucleation inhibiting layer, the refractive index of the patterned nucleation inhibiting layer is greater than or equal to a refractive index of the capping layer, and the refractive index of the capping layer is greater than a refractive index of the encapsulating layer.

6. The manufacturing method of the display panel as claimed in claim 1, wherein the common electrode is made of metal or metal oxide.

7. The manufacturing method of the display panel as claimed in claim 1, wherein a material of the conductive layer comprises magnesium, a material of the nucleation inhibiting layer is selected from the group consisting of 3-(4-biphenyl)-4-phenyl-5-tert-butylphenyl-1,2,4-triazole, bis(2-methyl-8-hydroxyquinoline-p-hydroxy)-4-biphenyl aluminum phenol, N(biphenyl-4-yl)9,9-dimethyl-N-(4(9-phenyl-9H-carbazol-3-yl)phenyl)-9H-fluoren-2-amine.

8. A manufacturing method of a display panel, comprising following steps of:
    providing a substrate, wherein the substrate comprises a pixel region and a non-pixel region disposed outside the pixel region, and the substrate comprises a common electrode disposed in the pixel region and the non-pixel region;
    forming a nucleation inhibiting layer on the common electrode disposed in the pixel region and the non-pixel region, wherein the nucleation inhibiting layer is used to inhibit a conductive layer from being formed on a surface of the nucleation inhibiting layer;
    using a laser to ablate and remove the nucleation inhibiting layer in the non-pixel region to form a patterned nucleation inhibiting layer; and
    forming the conductive layer on the common electrode in the non-pixel region.

9. The manufacturing method of the display panel as claimed in claim 8, wherein the step of using the laser to ablate and remove the nucleation inhibiting layer in the non-pixel region comprises following steps of:
    the laser outputs light with a wavelength of 340 nm to 370 nm, works with an output power of 1.5 Watt to 2.2 Watt, and outputs frequency of 500 kHz-2000 kHz to ablate the nucleation inhibiting layer in the non-pixel region to form the patterned nucleation inhibiting layer.

10. The manufacturing method of the display panel as claimed in claim 9, wherein the laser outputs the light with a wavelength of 355 nanometers, and the output power of the laser is 1.7 Watts to 2.0 Watts.

11. The manufacturing method of the display panel as claimed in claim 8, wherein a thickness of the nucleation inhibiting layer is 25 nanometers to 80 nanometers.

12. The manufacturing method of the display panel as claimed in claim 8, further comprising following steps of:
    forming a capping layer on a surface of the patterned nucleation inhibiting layer away from the substrate, wherein a thickness of the capping layer is greater than a thickness of the patterned nucleation inhibiting layer.

13. The manufacturing method of the display panel as claimed in claim 12, wherein a sum of the thicknesses of the capping layer and the patterned nucleation inhibiting layer ranges from 400 nanometers to 600 nanometers.

14. The manufacturing method of the display panel as claimed in claim 12, further comprising following steps of:
    forming an encapsulation layer covering the capping layer and the conductive layer;
    wherein a refractive index of the common electrode is greater than a refractive index of the patterned nucleation inhibiting layer, the refractive index of the patterned nucleation inhibiting layer is greater than or equal to a refractive index of the capping layer, and the refractive index of the capping layer is greater than a refractive index of the encapsulating layer.

15. The manufacturing method of the display panel as claimed in claim 8, wherein the common electrode is made of metal or metal oxide.

16. The manufacturing method of the display panel as claimed in claim 8, wherein a thickness of the conductive layer is greater than the thickness of the patterned nucleation inhibiting layer.

17. The manufacturing method of the display panel as claimed in claim 8, wherein a material of the conductive layer comprises magnesium, a material of the nucleation inhibiting layer is selected from the group consisting of 3-(4-biphenyl)-4-phenyl-5-tert-butylphenyl-1,2,4-triazole, bis(2-methyl-8-hydroxyquinoline-p-hydroxy)-4-biphenyl aluminum phenol, N(biphenyl-4-yl)9,9-dimethyl-N-(4(9-phenyl-9H-carbazol-3-yl)phenyl)-9H-fluoren-2-amine.

18. A display panel, wherein the display panel is manufactured by a manufacturing method as claimed in claim 1.

\* \* \* \* \*